(12) United States Patent
Amino et al.

(10) Patent No.: US 9,837,036 B2
(45) Date of Patent: Dec. 5, 2017

(54) GATE DRIVING CIRCUIT, DRIVING METHOD FOR GATE DRIVING CIRCUIT AND DISPLAY PANEL USING THE SAME

(71) Applicant: Samsung Display Co., Ltd., Yongin-si, Gyeonggi-Do (KR)

(72) Inventors: Tadashi Amino, Cheonan-si (KR); Jong Hee Kim, Yongin-si (KR); Masataka Kano, Hwaseong-si (KR); Jun Hyun Park, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 168 days.

(21) Appl. No.: 14/862,388

(22) Filed: Sep. 23, 2015

(65) Prior Publication Data

US 2016/0210926 A1    Jul. 21, 2016

(30) Foreign Application Priority Data

Jan. 20, 2015    (KR) .......................... 10-2015-0009413

(51) Int. Cl.
*G09G 3/36* (2006.01)
*H01L 27/12* (2006.01)
(Continued)

(52) U.S. Cl.
CPC .......... *G09G 3/3677* (2013.01); *G11C 19/184* (2013.01); *G11C 19/28* (2013.01);
(Continued)

(58) Field of Classification Search
CPC .............. G09G 3/3677; G09G 3/3688; G09G 2310/0283; G09G 2300/0408;
(Continued)

(56) References Cited

U.S. PATENT DOCUMENTS 5,517,542 A * 5/1996 Huq ..................... G11C 19/184
327/212
8,008,950 B2 * 8/2011 Jinta .................... H03K 19/017
327/108

(Continued)

FOREIGN PATENT DOCUMENTS

CN    103714789 A    4/2014
EP    2713361 A1    2/2014
(Continued)

*Primary Examiner* — Bryan Earles
(74) *Attorney, Agent, or Firm* — H.C. Park Associates, PLC

(57) ABSTRACT

A gate driving circuit including: a plurality of stages outputting signals to gate lines, the stages includes a first transistor of which one end and a control terminal are connected, one end and the control terminal are connected with a first input terminal, and the other end is connected to a second node, a second transistor including a control terminal connected to a first node, connected with a clock input terminal, and the other end connected to a first output terminal, a first capacitor of which one end is connected to the first node, the other end is connected to the other end of the second transistor and the first output terminal, and a third transistor of which one end is connected to the other end of the first transistor, the other end is connected with the first node, and a control terminal is connected to a third node.

12 Claims, 9 Drawing Sheets

(51) Int. Cl.
*G11C 19/18* (2006.01)
*G11C 19/28* (2006.01)

(52) U.S. Cl.
CPC ........ *H01L 27/124* (2013.01); *H01L 27/1255* (2013.01); *G09G 2300/0408* (2013.01); *G09G 2300/0417* (2013.01)

(58) Field of Classification Search
CPC ............. G09G 2300/0417; G09G 3/20; G09G 3/3225; G09G 3/3648; G11C 19/28; G11C 19/184; H01L 27/124; H01L 27/1255
See application file for complete search history.

(56) References Cited

U.S. PATENT DOCUMENTS

| | | | |
|---|---|---|---|
| 8,587,347 B2 | 11/2013 | Yoon et al. | |
| 8,872,751 B2* | 10/2014 | Kimura | G09G 3/20 345/100 |
| 2007/0171115 A1 | 7/2007 | Kim et al. | |
| 2009/0224245 A1* | 9/2009 | Umezaki | H01L 29/78678 257/59 |
| 2012/0207266 A1* | 8/2012 | Tobita | G09G 3/3677 377/64 |
| 2013/0141318 A1 | 6/2013 | Kim et al. | |
| 2014/0092078 A1 | 4/2014 | Yoon et al. | |
| 2015/0042383 A1 | 2/2015 | Kwon et al. | |
| 2015/0042547 A1 | 2/2015 | Kwon et al. | |
| 2015/0042638 A1 | 2/2015 | Kwon et al. | |
| 2015/0042689 A1 | 2/2015 | Kim et al. | |
| 2015/0371716 A1* | 12/2015 | Shao | G11C 19/287 345/100 |

FOREIGN PATENT DOCUMENTS

| | | |
|---|---|---|
| JP | 2014071452 A | 4/2014 |
| KR | 1020070074826 A | 7/2007 |
| KR | 1020130028274 A | 3/2013 |
| KR | 1020130083151 A | 7/2013 |
| KR | 1020140042308 A | 4/2014 |
| KR | 1020150017810 A | 2/2015 |
| KR | 1020150018969 A | 2/2015 |
| KR | 1020150018970 A | 2/2015 |
| KR | 1020150019098 A | 2/2015 |
| KR | 1020150031899 A | 3/2015 |

* cited by examiner

GATE DRIVING CIRCUIT, DRIVING METHOD FOR GATE DRIVING CIRCUIT AND DISPLAY PANEL USING THE SAME

CLAIM PRIORITY

This application claims priority to and the benefit of Korean Patent Application No. 10-2015-0009413 filed in the Korean Intellectual Property Office on Jan. 20, 2015, the entire contents of which are incorporated herein by reference.

BACKGROUND

1. Field of Disclosure

The present invention generally relates to a gate driving circuit, a driving method of the gate driving circuit, and a display device using the same.

2. Description of the Related Art

Generally, a liquid, crystal display which is one of the most common types of flat panel displays currently in use, includes two display panels with field generating electrodes such as a pixel electrode and a common electrode and a liquid crystal layer interposed therebetween. The liquid crystal display generates an electric field in the liquid crystal layer by applying voltage to the field generating electrodes, and determines the direction of liquid crystal molecules of the liquid crystal layer by the generated electric field, thereby controlling polarization of incident light so as to display images. The display devices include an organic light emitting diode display, a plasma display panel, an electrophoretic display, and the like, in addition to the liquid crystal display.

The above information disclosed in this Related Art section is only for enhancement of understanding of the background of the invention and therefore it may contain information that does not form the prior art that is already known in this country to a person of ordinary skill in the art.

SUMMARY

The present invention has been made in an effort to provide a gate driving circuit, a driving method of the gate driving circuit, and a display device using the same having advantages of preventing a high voltage from being applied to a transistor.

An exemplary embodiment of the present invention provides a gate driving circuit including: a plurality of stages outputting gate signals to corresponding gate lines, in which one of the plurality of stages includes a first transistor of which one end and a control terminal are connected to each other, one end and the control terminal are connected with a first input terminal to which an output signal or a scan starting signal of a previous stage is applied, and the other end is connected to a second node, a second transistor including a control terminal connected to a first node, one end connected with a clock input terminal, and the other en connected to a first output terminal, a first capacitor of which one end is connected to the first node, the other end is connected to the other end of the second transistor and the first output terminal, and a third transistor of which one end is connected to the other end of the first transistor, the other end is connected with the first node, and a control terminal is connected to a third node.

The gate driving circuit may further include a fourth transistor of which one end and a control terminal are connected to each other, one end and the control terminal are connected with the first input terminal, and the other end is connected with the control terminal of the third transistor.

The first capacitor may be precharged by the output signal or the scan starting signal of the previous stage through the second node and the third node.

The gate driving circuit may further include a fifth transistor of which one end and a control terminal are connected to each other, one end and the control terminal is connected to the second output terminal of the stage, and the other end is connected to the third node.

The gate driving, circuit may further include a sixth transistor including a control terminal connected to the first node, one end connected to the clock input terminal, and the other end connected to the second output terminal of the stage.

The output signal of the second output terminal may conduct the third transistor through the third node and connect the first node and the second node.

The gate driving circuit may further include: a seventh transistor including a control terminal connected to the second output terminal of the stage, one end connected to the first node, and the other end connected to a second voltage of the voltage input terminal of the stage, and an eighth transistor including a control terminal connected to the second output terminal of the stage, one end connected to the seventh transistor, and the other end connected to the second voltage of the voltage input terminal.

The gate driving circuit may further include a ninth transistor including a control terminal connected to the second output terminal of the stage, one end connected to the first output terminal, and the other end connected to the first voltage input terminal of the stage.

The gate driving circuit may further include a tenth transistor including a control terminal connected to the second output terminal of the stage, one end connected to the second output terminal, and the other end connected to the second voltage input terminal of the stage.

The second input signal of the second input terminal may form paths between the first node, the first output terminal and the second output terminal and the voltage input terminal and change a voltage of the first node, an output signal of the first output terminal, and an output signal of the second output terminal into low voltages.

Another exemplary embodiment of the present invention provides a driving method of as gate driving circuit including a plurality of stages outputting gate signals to corresponding gate lines, the method including: applying an output signal or a scan starting signal of a previous stage among the plurality of stages to a first node; bootstrapping a first capacitor of which one end is connected to the first node by a high-level clock signal; generating an output signal corresponding to the voltage of the first node to an output terminal of a current stage; and changing the first node and the output signal into a low level by an output signal of a next stage, in which the generating of the output signal includes connecting the first node and the second node by a transfer signal generated to correspond to the output signal through the third node.

The applying of the output signal or the scan starting signal to the first node may include precharging the first capacitor through the second node and the third node by the output signal or the scan starting signal of the previous stage.

The driving method may further include forming a path between the first node and the low voltage terminal by the second input signal and changing the voltage of the first node to a low voltage by the path.

Yet another exemplary embodiment of the present invention provides a display device including a display unit including a plurality of gate lines and a gate driver including a plurality of stages outputting gate signals to corresponding gate lines among the plurality of gate lines, in which the gate driver includes a first transistor of which one end and a control terminal are connected to each other, one end and the control terminal are connected with a first input terminal to which an output signal or a scan starting signal of a previous stage is applied, and the other end is connected to a second node, a second transistor including a control terminal connected to a first node, one end connected with a clock input terminal, and the other end connected to a first output terminal, a first capacitor of which one end is connected to the first node, the other end is connected to the other end of the second transistor and the first output terminal, and a third transistor of which one end is connected to the other end of the first transistor, the other end is connected with the first node, and a control terminal is connected to a third node.

The gate driver may further include a fourth transistor of which one end and a control terminal are connected to each other, one end and the control terminal are connected with the first input terminal, and the other end is connected with the control terminal of the third transistor.

The gate driver may further include a fifth transistor of which one end and a control terminal are connected to each other, one end and the control terminal is connected to the second output terminal of the stage, and the other end is connected to the third node.

According to an embodiment of the present invention, it is possible to prevent the deterioration of the transistor or reduction of the driving current by preventing a high voltage from being applied to the transistor.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION

Figure 1:
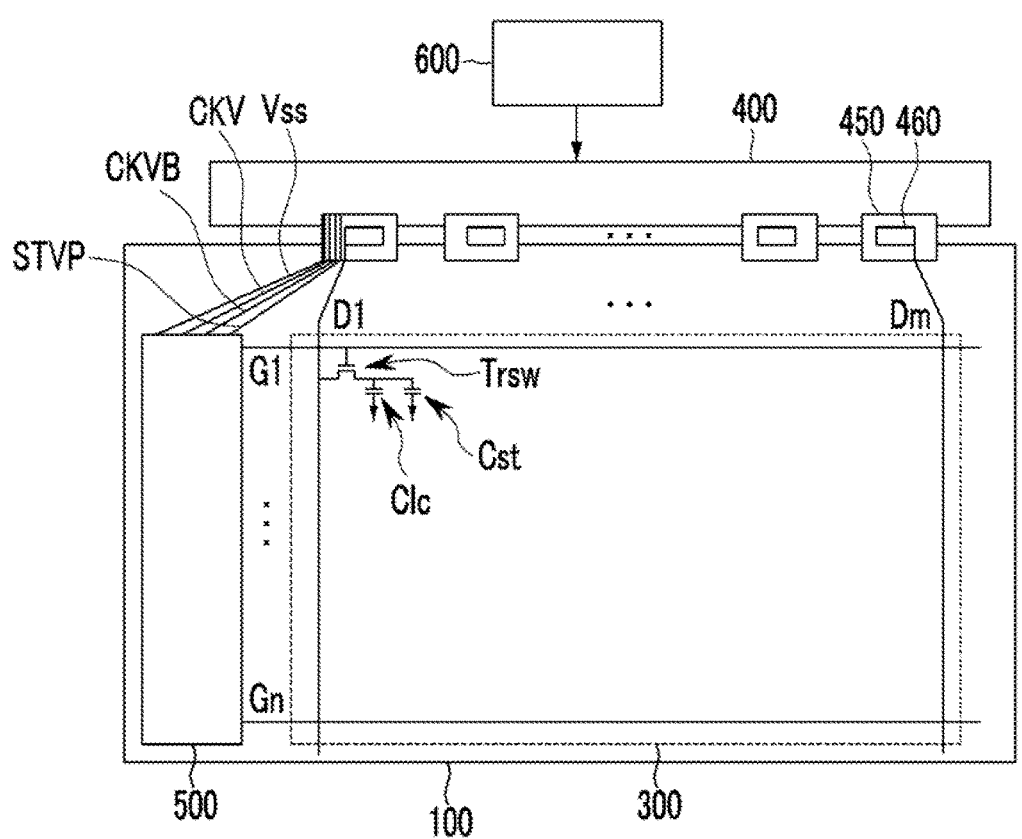
FIG. 1 is a plan view of a display device according to an exemplary embodiment of the present invention.

The present invention will be described more fully hereinafter with reference to the accompanying drawings, in which exemplary embodiments of the invention are illustrated. As those skilled in the art would realize, the described embodiments may be modified in various different ways, all without departing from the spirit or scope of the present invention. Further, the drawings and description are to be regarded as illustrative in nature and not restrictive. Like reference numerals designate like elements throughout the specification.

Unless explicitly described to the contrary, the word "comprise" and variations such as "comprises" or "comprising", will be understood to imply the inclusion of stated elements but not the exclusion of any other elements. Further, the terms "-er", "-or" and "module" described in the specification mean units for processing at least one function and operation and can be implemented by hardware components or software components and combinations thereof.

A display device generally includes a gate driver and a data driver. The gate driver may be patterned together with a gate line, a data line, a thin film transistor, and the like to be integrated on the device. As such, since the integrated gate driver is not required to form a separate gate driving chip, there is an advantage that a manufacturing cost is reduced.

Recent developments in display devices, an oxide semiconductor having high electron mobility has been mounted. In the display device, the gate driver may be decreased in thickness through the oxide semiconductor. However, when a high voltage is applied to a transistor of the gate driver, the transistor deteriorates, a driving current is reduced, and as a result, it is difficult to sufficiently charge the transistor.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or features relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the Spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate, the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a gate driving circuit, a driving method of the gate driving circuit, and a display device using the same according to an exemplary embodiment of the present invention will be described with reference to FIGS. 1 to 9.

FIG. 1 is a plan view of a display device according to an exemplary embodiment of the present invention.

Hereinafter, a display device according to an exemplary embodiment of the present invention will be described with reference to FIG. 1.

Referring to FIG. 1, a display device 100 according to an exemplary embodiment of the present invention includes a display unit 300 displaying an image, and a gate driver 500 applying gate voltages to gate lines G1 to Gn of a display unit 300. Meanwhile, data lines D1 to Dm of the display unit 300 receive data voltages from a data driver IC 460 which is formed on a film such as a flexible printed circuit film (FPC) 450 attached onto the display device 100.

Meanwhile, the gate driver 500 and the data driver IC 460 are controlled by a signal controller 600. In FIG. 1, the FPC 450 is electrically connected to a printed circuit board (PCB) 400, and a signal from the signal controller 600 is transferred to the data driver IC 460 and the gate driver 500 through the PCB 400 and the FPC 450. This is just an example, and the exemplary embodiment is not limited thereto.

The display unit 300 includes a plurality of pixels. FIG. 1 illustrates a liquid crystal display as an example. Meanwhile, an organic light emitting panel includes a thin film transistor and an organic light emitting diode, and other display panels include elements such as a thin film transistor, thereby forming the display unit 300. The display unit 300 includes a plurality of gate lines G1-Gn and a plurality of data lines D1-Dm, and the plurality of gate lines G1-Gn and the plurality of data lines D1-Dm insulatively cross each other.

Each of the plurality of pixels PX includes a thin film transistor TRsw, a liquid crystal capacitor Clc, and a storage capacitor Cst. A control terminal of the thin film transistor TRsw is connected to one gate line, an input terminal of the thin film transistor TRsw is connected to one data line, and an output terminal of the thin film transistor TRsw is connected to one terminal of the liquid crystal capacitor Clc and one terminal of the storage capacitor Cst. The other terminal of the liquid crystal capacitor Clc is connected to a common electrode, and the other terminal of the storage capacitor Cst receives a storage voltage Vcst applied from the signal controller 600. The structure of the pixel PX of the liquid crystal display also exist as various exemplary embodiment, and in FIG. 1, a pixel PX having an additional configuration to a basic structure of the pixel PX may also be applied to the present invention.

The plurality of data lines D1-Dm receives data voltages from the data driver IC 460, and the plurality of gate lines G1-Gn receives gate voltages from the gate driver 500.

The data driver IC 460 is formed at an upper side or a lower side of the display device 100 to be connected to the data lines D1-Dm extended in a vertical direction, and in the exemplary embodiment of FIG. 1, the data driver IC 460 is positioned at the upper side of the display device 100.

The gate driver 500 receives clock signals CKV and CKVB, a scan starting signal STVP, a low voltage Vss based upon a gate-off voltage, and to generate gate voltages (a gate-on voltage Von and a gate-off voltage Voff) and sequentially apply the gate-on voltages Von to the gate lines G1-Gn.

The clock signals CKV and CKVB, the scan starting signal STVP, and the low voltage Vss are applied to the gate driver 500 through the FPC 450 which is closest to the gate driver 500 among the FPCs 450 where the data driver ICs 460 are positioned as illustrated in FIG. 1. The signal is transferred to the film such as the FPC 450 through the PCB 400 from the outside or the signal controller 600.

Figure 2:
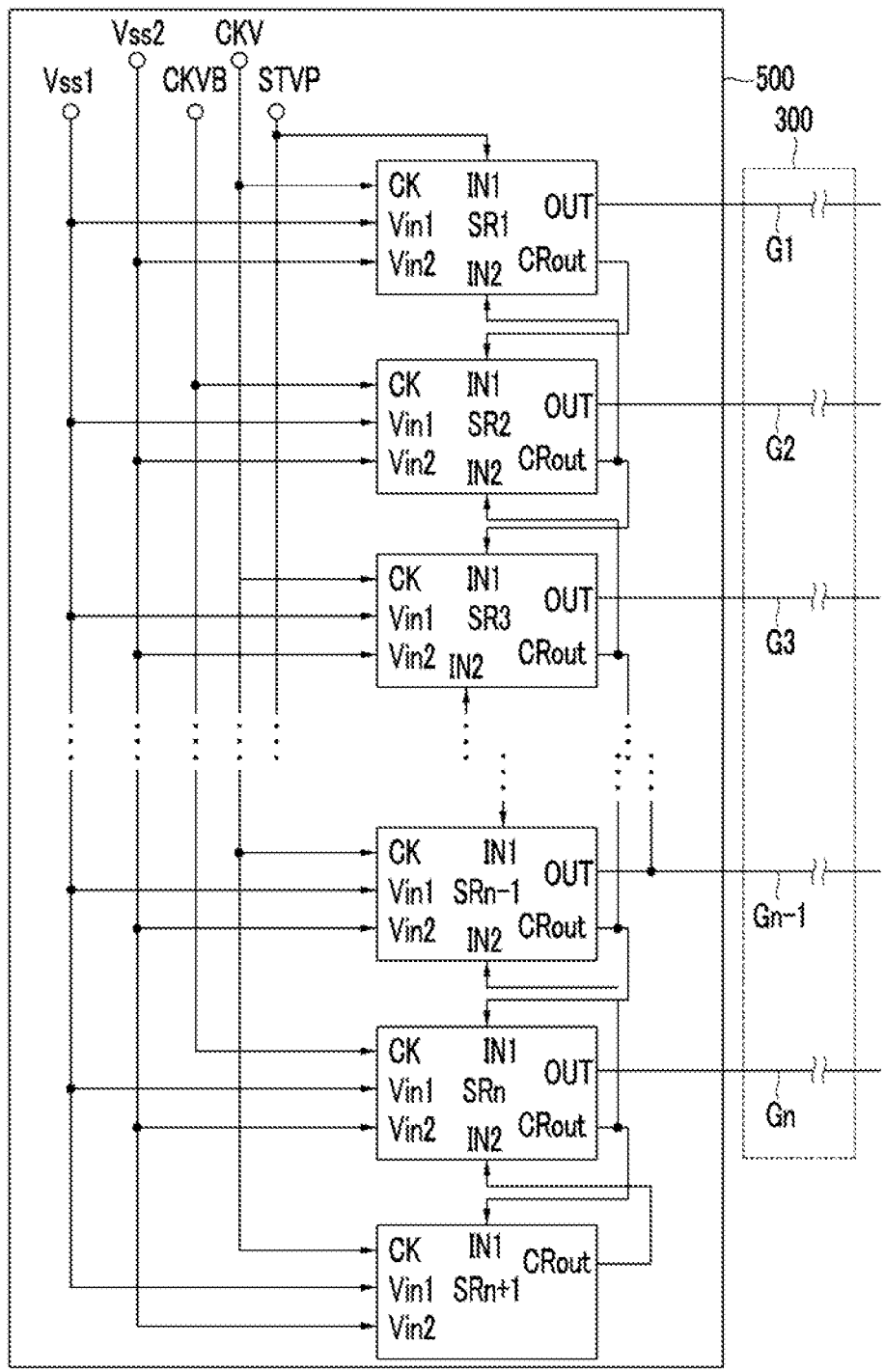
FIG. 2 is a block diagram illustrating a gate driver and a gate line in detail.

FIG. 2 is a block diagram illustrating a gate driver and a gate hue in detail.

The gate driver 500 includes a plurality of stages SR1, SR2, SR3, . . . , SRn−1, SRn. Each of the stages SR1, SR2, SR3, . . . , SRn−1, SRn includes two input terminals IN1 and IN2, one clock input terminal CK, two voltage input terminals Vin1 and Vin2, an output terminal GOUT, and a transfer signal output terminal CRout.

The first input terminal IN1 is connected to a transfer signal output terminal CRout of a front stage to receive an output signal CR[N−1] of a previous stage, and since a first stage SRI has no previous stage, the first stage SR1 receives the scan starting signal STVP to the first input terminal IN1.

The second input terminal IN2 is connected to a transfer signal output terminal CRout of the next stage SR3 to receive a transfer output signal CR[N+1] of the next stage.

A stage SRn connected to an n-th gate line Gn may form a dummy stage SRn+1 so as to receive the transfer output signal CR[N+1] from the next stage. The dummy stage is a stage generating and outputting a dummy gate voltage unlike other stages SR1-SRn.

That is, while the gate voltages output from other stages SR1-SRn are transferred through the gate lines G1 to Gn, the data voltage is applied to the pixel so as to display the image. However, the dummy stage SRn+1 may not be connected to the gate lines G1 to Gn, and is connected with a gate line (not illustrated) of a dummy pixel not illustrated) which does not display an image even though being connected with the gate lines G1 to Gn. Accordingly, the dummy stage SRn+1 may not be used to display the image.

The clock signals CKV and CKVB are applied to the clock input terminal CK, and a first clock signal CKV is applied is applied to clock input terminals CK of odd stages among the plurality of stages SR1 to SRn+1 and a second clock signal CKVB is applied to clock input terminals CK of even stages. The first clock signal CKV and the second clock signal CKVB are clock signals having opposite phases.

Voltage input terminals Vin1 and Vin2 may be formed by two voltage input terminals and include a first voltage input terminal Vin1 and a second voltage input terminal Vin2, in addition, low voltages Vss1 and Vss2 corresponding to gate-off voltages are applied to the voltage input terminals Vin1 and Vin2. A first low voltage VSS1 is applied to the first voltage input terminal Vin1, and a second low voltage VSS2 is applied to the second voltage input terminal Vin2. The first low voltage VSS1 and the second low voltage VSS2 may have various values according to an exemplary embodiment. For example, the value of the first low voltage VSS1 may be −5 V and the value of the second low voltage VSS2 may be −10V.

An operation of the gate driver 500 will be described below.

First, the first stage SR1 receives the first clock signal CKV provided from the outside through the clock input terminal CK, the scan starting signal STVP through the input terminal IN1, the first low voltage Vss1 to the first voltage input terminal Vin1, the second low voltage Vss2 to the second voltage input terminal Vin2, and the output signal Gout[2] provided from the second stage SR2 through the second input terminal IN2.

The second stage SR2 receives the second clock signal CKVB provided from the outside through the clock input terminal CK, the transfer signal output signal CRout[1] of the first stage SR1 through the input terminal IN1, the first low voltage Vss1 to the first voltage input terminal Vin1, the second low voltage Vss2 to the second voltage input terminal Vin2 and the output signal Gout[3] provided from the third stage SR3 through the second input terminal IN2.

The third stage SR3 receives the first clock signal CKV provided from the outside through the clock input terminal CK, the transfer signal output signal CRout[2] of the second stage SR2 through the input terminal IN1, the first low voltage Vss1 to the first voltage input terminal Vin1, the second low voltage Vss2 to the second voltage input terminal Vin2, and the output signal Gout[3] provided from the fourth stage SR4 through the second input terminal IN2.

In the same manner as described above, the n−1-th stage SRn−1 receives the first clock signal CKV provided from the outside through the clock input terminal CK, the transfer output signal SRout[n−2] of the n−2-th stage SRn−2 through the input terminal IN1, the first low voltage Vss1 to the first voltage input terminal Vin1, the second low voltage Vss2 to the second voltage input terminal Vin2, and the output signal Gout[n] provided from the n-th stage SRn through the second input terminal IN2.

The n-th stage SRn receives the second clock signal CKVB provided from the outside through the clock input terminal CK, the transfer output signal SRout[n−1] of the n−1-th stage SRn−1 through the input terminal IN1, the first low voltage Vss1 to the first voltage input terminal Vin1, the second low voltage Vss2 to the second voltage input termi-nal Vin2, and the output signal Gout[n+1] provided from the dummy stage SRn+1 through the second input terminal IN2.

Hereinafter, a structure of the stage SR of the gate driver connected to one gate line will be described in more detail with reference to FIG. 3.

Figure 3:
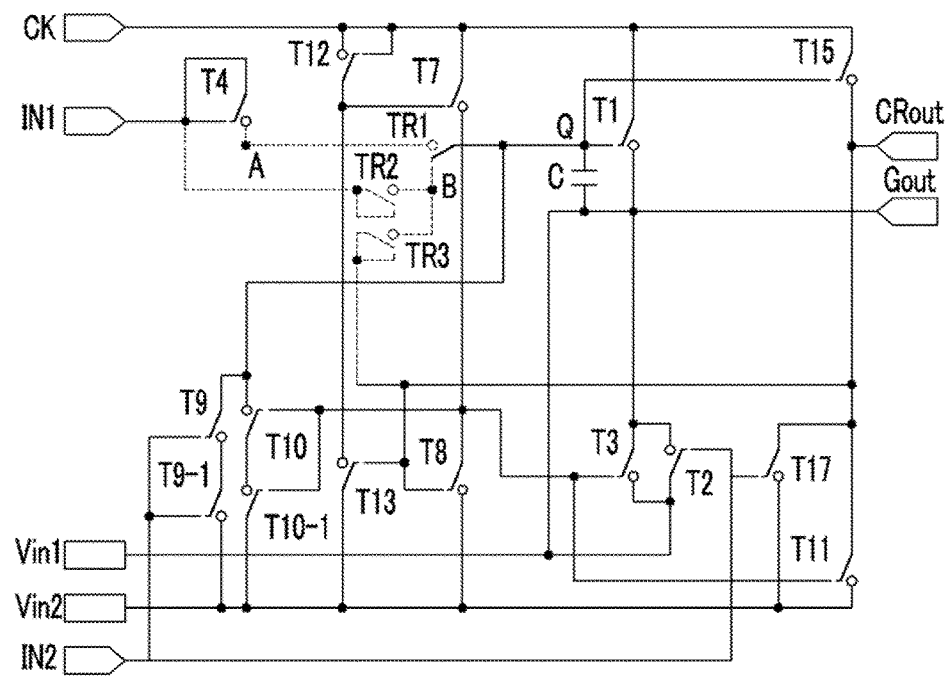
FIG. 3 is a circuit diagram illustrating one stage of the gate driver according to a first exemplary embodiment of the present invention.

FIG. 3 is a circuit diagram illustrating one stage of the gate driver according to a first exemplary embodiment of the present invention.

One stage SRn of the gate driver according to the first exemplary embodiment of the present invention includes a first transistor T1, a second transistor T2, a third transistor T3, a fourth transistor T4, a seventh transistor T7, an eighth transistor T8, a ninth transistor T9, a 9-1-th transistor T9-1, a tenth transistor T10, a 10-1-th transistor T10-1, an eleventh transistor T11, a twelfth transistor T12, a thirteenth transistor T13, a fifteenth transistor T15, a seventeenth transistor T17, and a capacitor C, and a first additional transistor TR1, a second additional transistor TR2, and a third additional transistor TR3.

A control terminal of the first transistor T1 is connected to a first node Q, one end is connected to the clock input terminal CK, and the other end is connected to the gate voltage output terminal GOUT.

A control terminal of the second transistor T2 is connected to the second input terminal IN2. One end of the second transistor T2 is connected to the other end of the third transistor 13, and the other end thereof is connected to the gate voltage output terminal GOUT.

A control terminal of the third transistor T3 is connected with a control terminal of the eleventh transistor T11. One end of the third transistor T3 is connected to the other end of the first transistor T1 and the other end thereof is connected to one end of the second transistor T2.

One end and a control terminal of the fourth transistor T4 are commonly connected (hereinafter, diode-connected) to the first input terminal IN1 and the other end is connected to a node A (a second node). When a high voltage is applied, from the first input terminal IN1, one end serves to transfer the high voltage to the node A.

A control terminal of the seventh transistor T7 is connected to the other end of the thirteenth transistor T13, one end is connected to the clock input terminal CK, and the other end is connected to one end of the eighth transistor T8.

A control terminal of the eighth transistor T8 is connected to the transfer signal output terminal CRout, one end is connected to the other end of the seventh transistor T7, and the other end is connected to the second voltage input terminal Vin2.

The other end of the ninth transistor T9 is connected with one end of the 9-1-th transistor T9-1, and both control terminals of the transistor T9 and the 9-1-th transistor T9-1 are connected to the second input terminal IN2. One end of the ninth transistor T9 is connected to the first node (Q node), and the other end of the 9-1-th transistor T9-1 is connected to the second voltage input terminal Vin2.

The ninth transistor T9 and the 9-1-th transistor T9-1 transfer the second low voltage VSS2 to the node Q according to a voltage of the second input terminal IN2.

The other end of the tenth transistor T10 is connected with one end of the 10-1-th transistor T10-1, and both control terminals of the tenth transistor T10 and the 10-1-th transistor T10-1 are connected to the control terminal of the third transistor T3. The other end of the tenth transistor T10 is connected to the Q node, and one end of the 10-1-th transistor T10-1 is connected to the second voltage input terminal Vin2. The tenth and 10-1-th transistors T10 and T10-1 transfer the second low voltage VSS2 to the node Q according to a voltage of the control terminal of the third transistor T3.

One end of the eleventh transistor T11 is connected to the other end of the fifteenth transistor T15, and the other end thereof is connected to the second voltage input terminal Vin2. The eleventh transistor T11 transfers the second low voltage VSS2 to the other end of the fifteenth transistor T15 according to a voltage of the control terminal of the third transistor T3 to change the voltage of the transfer signal output terminal CRout into a low level.

A control terminal of the other end of the twelfth transistor T12 are connected (diode-connected) to the clock input terminal CK, and one end is connected to the control terminal of the seventh transistor and the other end of the thirteenth transistor T13.

A control terminal of the thirteenth transistor T13 is connected with the transfer signal output terminal CRout. One end of the thirteenth transistor T13 is connected with the second voltage input terminal Vin2, and the other end is connected with one end of the twelfth transistor T12.

The clock input terminal CK is connected to one end of the fifteenth transistor T15, and the control terminal is connected to the node Q. The other end of the fifteenth transistor T15 is connected to the transfer signal output terminal CRout outputting a transfer signal CR.

A control terminal of the seventeenth transistor T17 is connected to the second input terminal IN2. One end of the seventeenth transistor T17 is connected to the transfer signal output terminal CRout, and the other end thereof is connected with the second voltage input terminal Vin2.

Meanwhile, one end of the capacitor C is connected to the control terminal, of the first transistor T1, and the other end thereof is connected to the other end of the first transistor T1.

Further, the control terminal of the first additional transistor TR1 is connected with a third node (node B). One end of the first additional transistor TR1 is connected with the first node (Q node), and the other end of the first additional transistor TR1 is connected with the second node (node A).

A control terminal and one end of the second additional transistor TR2 are connected to the first input terminal IN1, and the other end of the second additional transistor TR2 is connected with the third node (node B).

A control terminal and one end of the third additional transistor TR3 are connected to the transfer signal output terminal CRout. The other end of the third additional transistor TR3 is connected with the third node (node B).

The second additional transistor TR2 is conducted by the first input signal of the first input terminal IN1 and applies the first input signal to the third node (node B). In addition the output of the second additional transistor TR2 conducts the first additional transistor TR1 and transfers the high level voltage of the second node (node A) to the first node (node Q). A difference in voltage between the control terminal and the output terminal of the first transistor T1 is generated by the voltage of the first node (node Q) and stored in the capacitor C, and then the capacitor C is precharged.

In addition, the third additional transistor TR3 is conducted by the transfer signal CR of the transfer signal output terminal CRout and applies the transfer signal CR to the third node (node B). In addition, the output of the third additional transistor TR3 conducts the first additional transistor TR1 during bootstrapping.

Hereinafter, an operating process of the gate driver will be described in more detail with reference to FIGS. 4 to 9.

Figure 4:
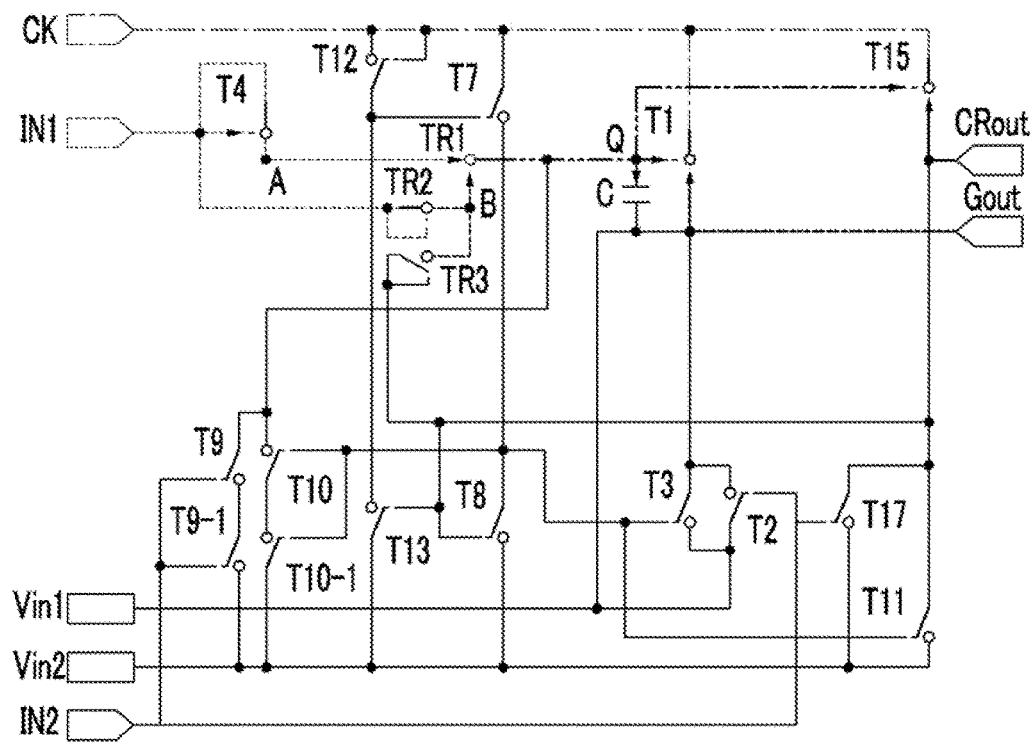
FIG. 4 is a diagram illustrating that the gate driver in FIG. 3 performs a pre-charging operation.
Figure 5:
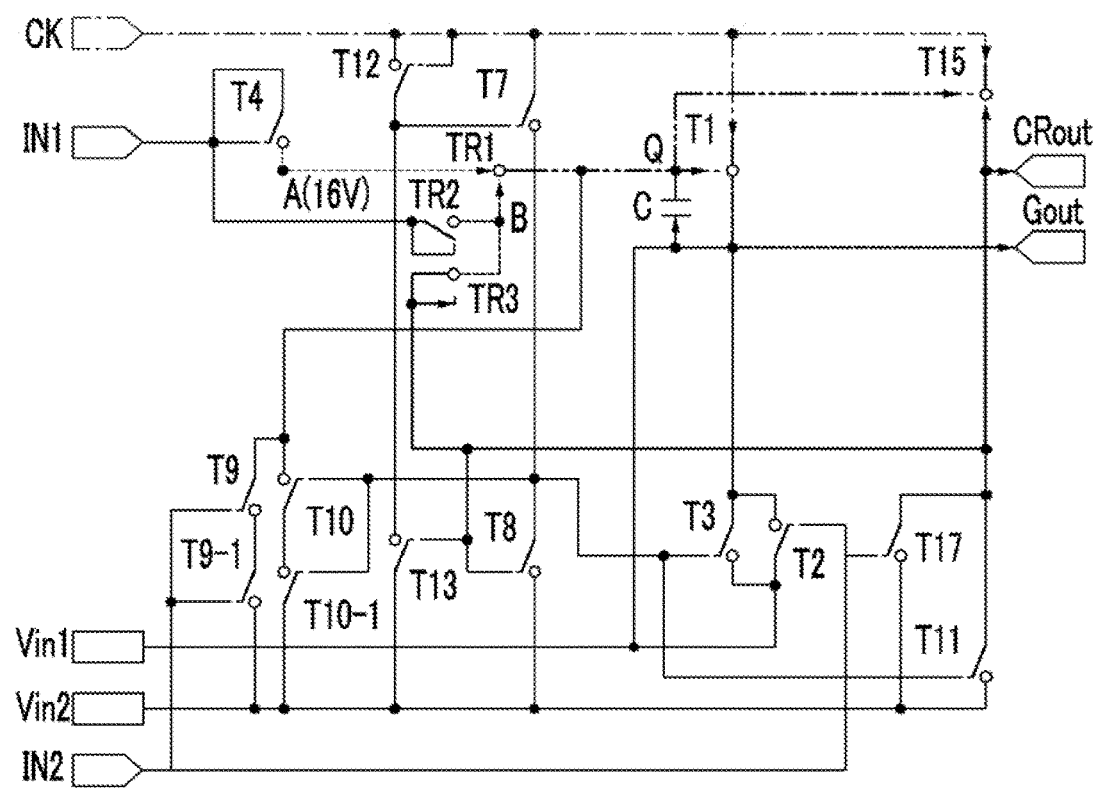
FIG. 5 is a diagram illustrating that the gate driver in FIG. 3 performs a bootstrapping operation.
Figure 6:
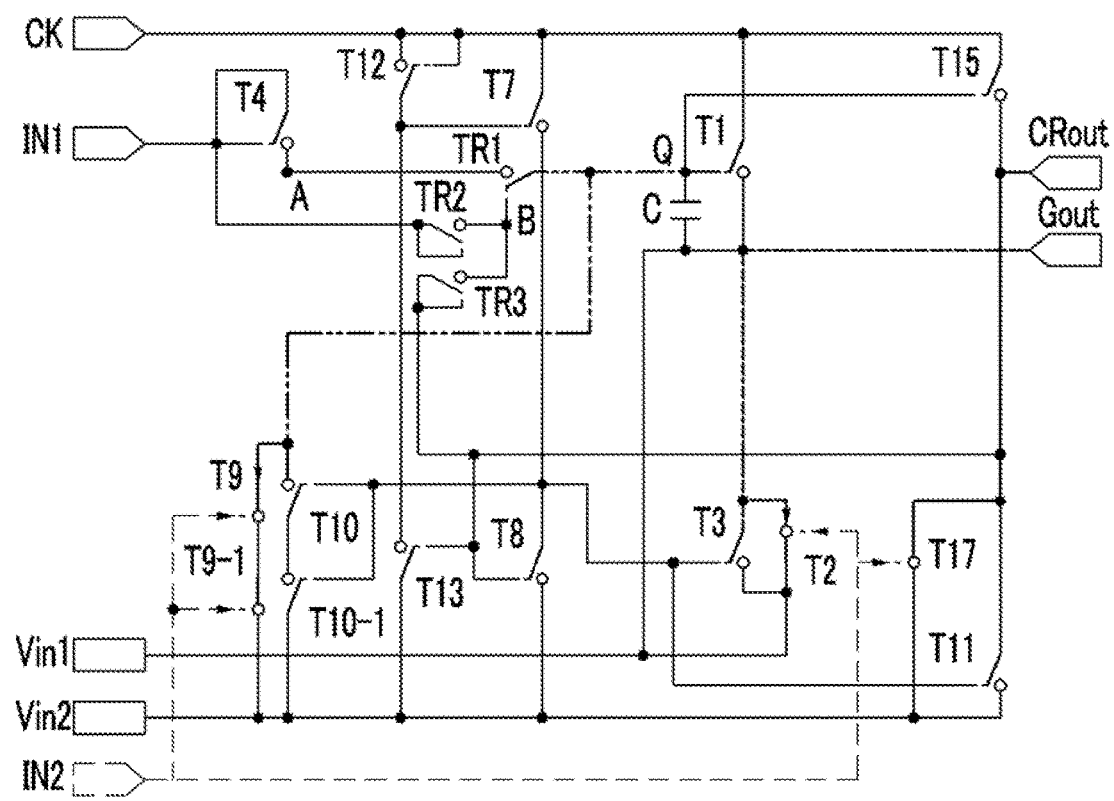
FIG. 6 is a diagram illustrating that the gate driver in FIG. 3 performs a discharging operation.
Figure 7:
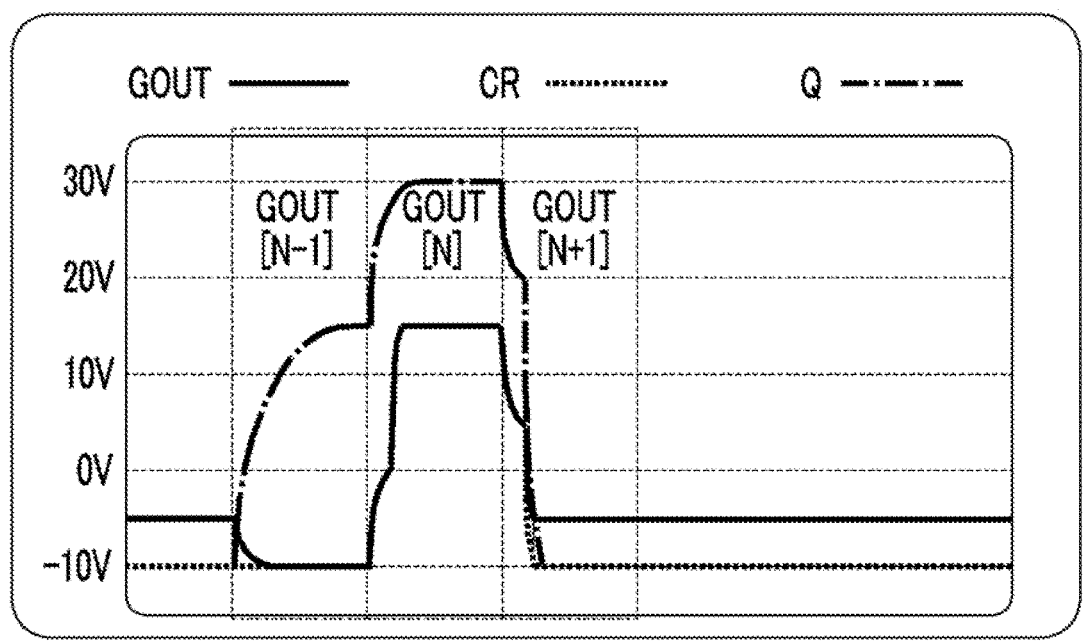
FIG. 7 is a timing diagram illustrating operation characteristics of an output terminal and a first node according to the operation of the gate driver in FIG. 3.
Figure 8:
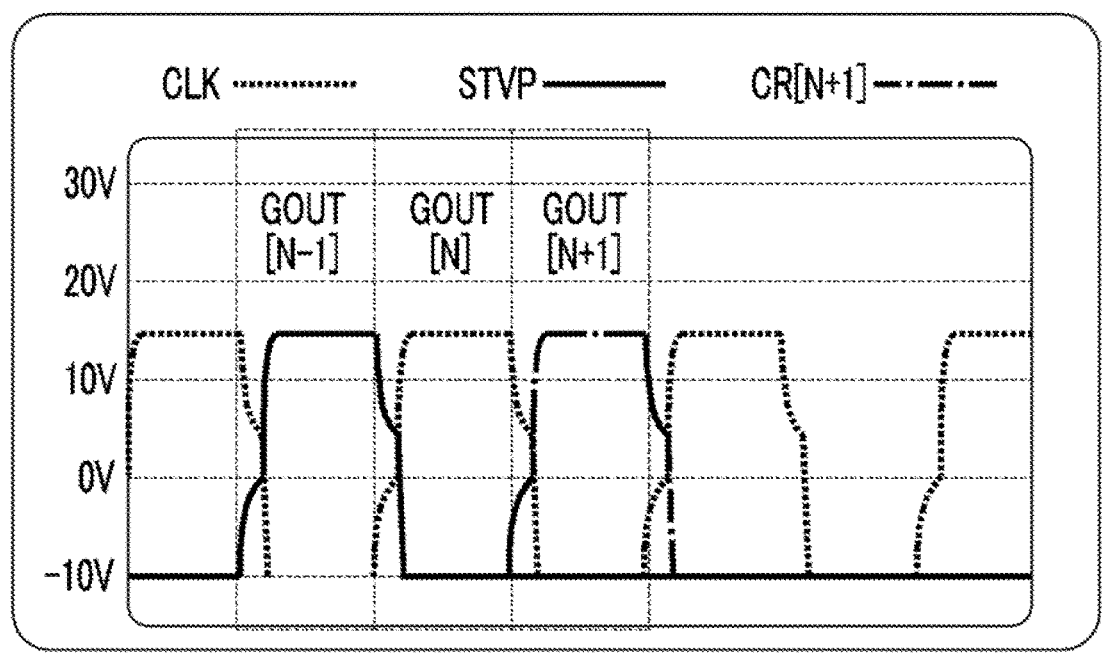
FIG. 8 is a timing, diagram illustrating operation characteristics of a clock input terminal, a first input terminal, and a second input terminal according to an operation of the gate driver in FIG. 3.
Figure 9:
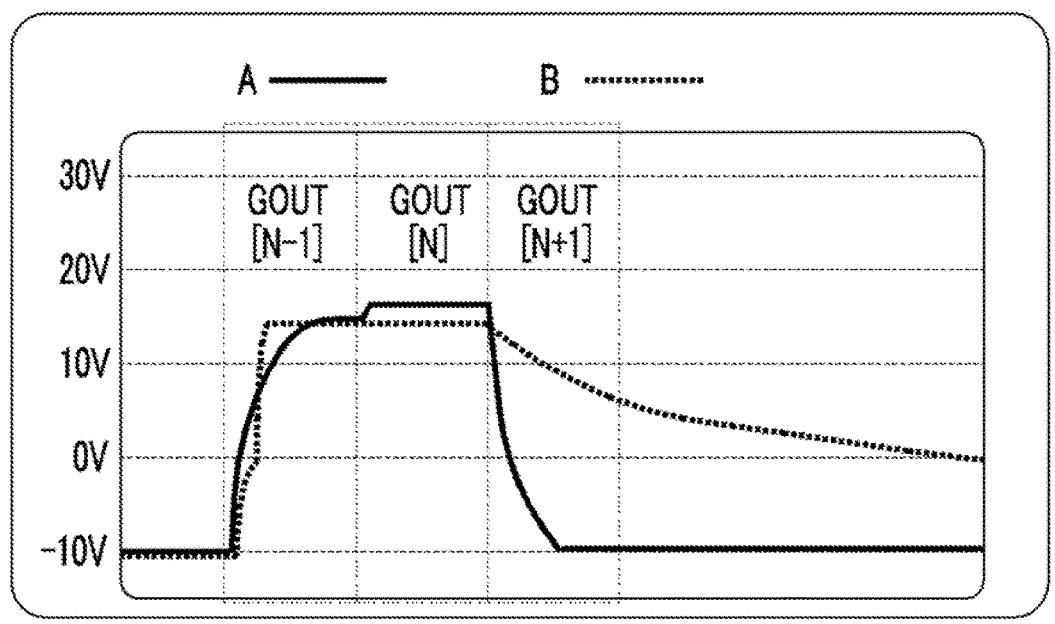
FIG. 9 is a timing diagram illustrating operation characteristics of a node A and a node B according to the operation of the gate driver in FIG. 3.

FIG. 4 is a diagram illustrating that the gate driver in FIG. 3 performs a pre-charging operation. FIG. 5 is a diagram illustrating that the gate driver in FIG. 3 performs a bootstrapping operation. FIG. 6 is a diagram illustrating that the gate driver in FIG. 3 performs a discharging operation. In addition, FIG. 7 is a timing diagram illustrating operation characteristics of an output terminal and a first node according to the operation of the gate driver in FIG. 3. FIG. 8 is a timing diagram illustrating operation characteristics of a clock input terminal, a first input terminal, and a second input terminal according to an operation of the gate driver in FIG. 3. FIG. 9 is a timing diagram illustrating operation characteristics of a node A and a node B according to the operation of the gate driver in FIG. 3.

Referring to FIGS. 4, and 7 to 9, in a step GOUT[N−1] of pre-charging, the fourth transistor T4 is conducted by the first input signal of the first input terminal IN1 and the voltage of the node A is increased. In addition, the second additional transistor TR2 is conducted by the first input signal, and the voltage of the node B conducts the first additional transistor TR1 and the voltage of the node A is transferred to the node Q to charge the capacitor C. Here, the first input signal may be 14 V.

In addition, as illustrated in FIG. 5, in a step GOUT[N] of bootstrapping, the transfer signal output terminal CRout and the output terminal OUT are output to 14 V. In addition, the third additional transistor TR3 is conducted by the transfer signal CR of the transfer signal output terminal CRout, and the node B is continuously maintained to 14 V.

In this case, by bootstrapping, the node Q becomes 30 V the node B becomes 14 V, the node A is slightly charged by the first additional transistor TR1 to be about 16 V.

Accordingly, since the first input signal is −10 V and the node A is about 16 an internal-pressure problem of the fourth transistor T4 does not occur. In addition, since a period when the 14 V is applied to the gate of the first additional transistor TR1 is only 2 horizontal period of 1 frame period, a positive shift does not occur in the first additional transistor TR1.

Referring to FIG. 6, in a step GOUT[N+1] of discharging or holding, when a second input signal of the second input terminal IN2 conducts the ninth transistor T9 and the 9-1-th transistor T9-1, a path is formed between the node Q and the second voltage input terminal Vin2, and the second low voltage VSS2 is transferred to the node Q.

Further, the second input signal of the second input terminal IN2 conducts the second transistor T2. A path is formed between the output terminal GOUT and the first voltage input terminal Vin1, and the first low voltage VSS1 is transferred to the output terminal GOUT.

Further, the second input signal of the second input terminal IN2 conducts the seventeenth transistor T17. A path is formed between the transfer signal output terminal CRout and the second voltage input terminal Vin2, and the second low voltage VSS2 is transferred to the output terminal CRout.

In addition, during bootstrapping, a potential between the source and the gate reaches 40 V or more in the ninth transistor T9 and the 9-1-th transistor T9-1, but since the movement is discharged, even though the potential between the source and the gate reaches to 40 V or more, a discharging function of the transistor may not be damaged.

In addition, the first to third additional transistors TR1 to TR3 do not have an additional effect during discharging or holding.

As such in the gate driving circuit, the driving method of the gate driving circuit, and the display device using the same: according to the embodiment of the present invention, it is possible to prevent the deterioration of the transistor or reduction of the driving current by preventing a high voltage from being applied to the transistor.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A gate driving circuit, comprising:
a plurality of stages outputting gate signals to corresponding gate lines, wherein one of the plurality of stages includes
a first transistor of which a first end and a control terminal are connected to each other, the first end and the control terminal are connected with a first input terminal, through a second node, to which an output signal or a scan starting signal of a previous stage is applied, and a second end is connected to a clock input terminal,
a second transistor including a control terminal connected to a first node, a first end connected with the clock input terminal, and a second end connected to a first output terminal,
a first capacitor of which a first end is connected to the first node, a second end is connected to the second end of the second transistor and the first output terminal,
a third transistor of which a first end is connected to the second end of the first transistor, a first end is connected with the first node, and a control terminal is connected to a third node,
a fourth transistor of which a first end is connected with the control terminal of the first transistor, a second end and a control terminal are connected to each other, and a second end and the control terminal are connected with the first input terminal, and
a fifth transistor of which a first end and a control terminal are connected to each other, the first end and the control terminal are connected to a second output terminal, and a second end is connected to the third node.

2. The gate driving circuit of claim 1, wherein:
the first capacitor is precharged by the output signal or the scan starting signal of the previous stage through the second node and the third node.

3. The gate driving circuit of claim 1 further comprising:
a sixth transistor including a control terminal connected to the first node, a first end connected to the second output terminal, and a second end connected to the clock input terminal.

4. The gate driving circuit of claim 3, wherein:
the output signal of the second output terminal causes the eleventh transistor to conduct through the third node and connect the first node and the second node.

5. The gate driving circuit of claim 1, further comprising:
a seventh transistor including a control terminal connected to the clock input terminal, a first end connected to a second voltage input terminal, and a second end connected to a second output terminal; and
an eighth transistor including a control terminal connected to the second voltage input terminal, a first end connected to the seventh transistor, and a second end connected to the second voltage input terminal.

6. The gate driving circuit of claim 5, further comprising:
a ninth transistor including a control terminal connected to the second input terminal, a first end connected to the first output terminal, and a second end connected to the second voltage input terminal.

7. The gate driving circuit of claim 6 further comprising:
a tenth transistor including a control terminal connected to the clock input terminal, a first end connected to the output terminal, and a second end connected to the second voltage input terminal.

8. The gate driving circuit of claim 7, wherein:
the second input signal of the second input terminal forms paths between the first node, the first output terminal, the second output terminal, and the second voltage input terminal, and changes a voltage of the first node, an output signal of the first output terminal, and an output signal of the second output terminal into low voltages.

9. A driving method of a gate driving circuit including a plurality of stages outputting gate signals to corresponding gate lines, the method comprising:
applying an output signal or a scan starting signal of a previous stage among the plurality of stages to a first node;
bootstrapping a first capacitor of which one end is connected to the first node by a high-level clock signal;
generating an output signal corresponding to the voltage of the first node to an output terminal of a current stage; and
changing the first node and the output signal into a low level by an output signal of a next stage,
wherein the generating of the output signal includes connecting the first node and a second node by a transfer signal generated to correspond to the output signal through the third node,
wherein a first transistor of which a first end is connected with the control terminal of a second transistor, a second end and a control terminal are connected to each other, and a second end and the control terminal are connected with the first input terminal, and
wherein a third transistor of which a first end and a control terminal are connected to each other, the first end and the control terminal are connected to a second output terminal, and a second end is connected to the third node.

10. The driving method of claim 9, wherein:
the applying of the output signal or the scan starting signal to the first node comprises precharging the first capacitor through the second node and the third node by the output signal or the scan starting signal of the previous stage.

11. The driving method of claim 10, further comprising:
forming a path between the first node and the low voltage terminal by the second input signal and changing the voltage of the first node to a low voltage by the path.

12. A display device, comprising:
a display unit including a plurality of gate lines and a gate driver including a plurality of stages outputting gate signals to corresponding gate lines among the plurality of gate lines,
wherein the gate driver comprises:
a first transistor of which a first end and a control terminal are connected to each other, the first end and the control terminal are connected with a first input terminal to which an output signal or a scan starting signal of a previous stage is applied, and a second end is connected to a clock input terminal,
a second transistor including a control terminal connected to a first node, a first end connected with a clock input terminal, and a second end connected to a first output terminal, a first capacitor of which a first end is connected to the first node, a second end is connected to the second end of the second transistor and the first output terminal, a third transistor of which a second end is connected to the first end of the first transistor, a first end is connected with the first node, and a control terminal is connected to a third node, a fourth transistor of which a first end is connected with the control terminal of the first transistor, a second end and a control terminal are connected to each other, and a second end and the control terminal are connected with the first input terminal, and a fifth transistor of which a first end and a control terminal are connected to each other, the first end and the control terminal are connected to a second output terminal, and a second end is connected to the third node.

* * * * *